(12) United States Patent
Siann et al.

(10) Patent No.: US 11,871,350 B2
(45) Date of Patent: *Jan. 9, 2024

(54) STAGGERED EXTENDED SLEEP CYCLES, COMPRISING ON AND OFF SLEEP DURATIONS, IN WIRELESS DEVICES

(71) Applicant: Tracie Wireless LLC, Burlington, MA (US)

(72) Inventors: Jonathan Siann, San Diego, CA (US); Murat Karsi, San Diego, CA (US)

(73) Assignee: Tracie Wireless LLC, Burlington, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/391,938

(22) Filed: Aug. 2, 2021

(65) Prior Publication Data
US 2021/0368449 A1 Nov. 25, 2021

Related U.S. Application Data

(63) Continuation of application No. 16/858,236, filed on Apr. 24, 2020, now Pat. No. 11,082,925, which is a
(Continued)

(51) Int. Cl.
*H04W 68/00* (2009.01)
*H04W 52/02* (2009.01)
(Continued)

(52) U.S. Cl.
CPC ....... *H04W 52/0235* (2013.01); *H03M 1/002* (2013.01); *H04W 52/0216* (2013.01); *H04W 56/001* (2013.01); *H04W 68/00* (2013.01); *H04W 76/28* (2018.02); *H04W 84/027* (2013.01); *H04W 40/005* (2013.01); *H04W 68/02* (2013.01); *H04W 76/27* (2018.02); *H04W 84/042* (2013.01)

(58) Field of Classification Search
CPC ... H04W 76/048; H04W 76/28; H04W 68/00; H04W 84/027; H04W 40/005; H04W 56/001
See application file for complete search history.

(56) References Cited

U.S. PATENT DOCUMENTS 5,883,885 A    3/1999  Raith
10,638,426 B2 * 4/2020  Siann ............... H04W 52/0235
(Continued)

OTHER PUBLICATIONS

International Search Report and Written Opinion dated Oct. 2, 2018 for related International Application No. PCT/US2018/034461, 8 pages.

*Primary Examiner* — Salvador E Rivas
(74) *Attorney, Agent, or Firm* — David H. Judson (57) ABSTRACT

Extended sleep in a wireless device. In an embodiment, synchronized parameters, used by a wireless device to define an extended-sleep cycle, are stored at a system. Based on the synchronized parameters, the system determines a transmission time at which to transmit a message over the wireless communication network such that the message will be received by the wireless device during a portion of the extended-sleep cycle during which the wireless device is monitoring paging occasions. The message is then queued until it is transmitted at the transmission time.

19 Claims, 7 Drawing Sheets

Related U.S. Application Data continuation of application No. 15/988,980, filed on May 24, 2018, now Pat. No. 10,638,426.

(60) Provisional application No. 62/511,262, filed on May 25, 2017.

(51) Int. Cl.
| | | |
|---|---|---|
| *H04W 76/28* | (2018.01) | |
| *H04W 84/02* | (2009.01) | |
| *H03M 1/00* | (2006.01) | |
| *H04W 56/00* | (2009.01) | |
| *H04W 76/27* | (2018.01) | |
| *H04W 40/00* | (2009.01) | |
| *H04W 68/02* | (2009.01) | |
| *H04W 84/04* | (2009.01) | |

(56) References Cited

U.S. PATENT DOCUMENTS

| | | | |
|---|---|---|---|
| 11,082,925 B2* | 8/2021 | Siann | H03M 1/002 |
| 2008/0170526 A1* | 7/2008 | Narang | H04W 52/0216 455/574 |
| 2010/0203905 A1 | 8/2010 | Chaubey et al. | |
| 2011/0244792 A1* | 10/2011 | Park | H04W 52/0216 455/39 |
| 2012/0120858 A1 | 5/2012 | Das et al. | |
| 2015/0173039 A1* | 6/2015 | Rune | H04W 52/0216 370/311 |
| 2016/0044605 A1* | 2/2016 | Vajapeyam | H04W 76/28 370/311 |
| 2016/0249406 A1* | 8/2016 | Bangolae | H04L 1/1887 |
| 2016/0262014 A1 | 9/2016 | Zeng et al. | |
| 2017/0006659 A1* | 1/2017 | Jha | H04W 72/30 |

* cited by examiner

STAGGERED EXTENDED SLEEP CYCLES, COMPRISING ON AND OFF SLEEP DURATIONS, IN WIRELESS DEVICES

CROSS-REFERENCE TO RELATED APPLICATIONS

This application is a continuation of U.S. patent application Ser. No. 16/858,236, filed on Apr. 24, 2020, which is a continuation of U.S. patent application Ser. No. 15/988,980, filed on May 24, 2018, which claims priority to U.S. Provisional Patent App. No. 62/511,262, filed on May 25, 2017, each of which is incorporated herein by reference as if set forth in full.

This application is related to U.S. International Patent App. No. PCT/US2015/037731, filed on Jun. 25, 2015, and titled "Extending Sleep Mode in Wireless Device," which claims priority to U.S. Provisional Patent App. No. 62/017,752, filed on Jun. 26, 2015, and titled "Method, System and Apparatus for Extended Sleep Operations, each of which is hereby incorporated herein by reference as if set forth in full.

BACKGROUND

Field of the Invention

The embodiments described herein are generally directed to wireless communications, and, more particularly, to extending a sleep amount in an idle mode of a wireless device.

Description of the Related Art

To alert a wireless device to incoming data (e.g., a short messaging service (SMS) message), a communication network may broadcast paging messages during periodic paging occasions. Accordingly, a conventional wireless device may wake up at each paging occasion in order to monitor for paging messages from the communication network. For example, in a Long-Term Evolution (LTE) communication network, a paging cycle (i.e., the time interval between consecutive paging occasions) may be 0.32, 0.64, 1.28, or 2.56 seconds. A conventional wireless device, operating in an LTE communication network, wakes up and monitors the Physical Downlink Control Channel (PDCCH) for paging messages once every paging cycle (e.g., every 1.28 seconds).

The length of the paging cycle may have a significant impact on the power profile of a wireless device. When the length of the paging cycle is relatively short, the wireless device will wake up and monitor for paging messages from the communication network more frequently. Consequently, even though the wireless device may be more responsive (i.e., quicker to detect incoming data), as a result of the shorter paging cycle, it will also consume significantly more power and drain its power supply at a faster rate.

Many wireless applications (e.g., pet tracking) may limit the physical dimensions of the corresponding wireless devices (e.g., wireless pet collar). A compact wireless device may be unable to accommodate a large battery, and therefore, cannot sustain conventional paging cycles (e.g., 1.28 seconds) over a reasonable operation period (e.g., two or three years).

Moreover, the requirements for responsiveness and power consumption may vary for different wireless applications and/or wireless devices, as well as for different operational conditions. For example, some wireless applications (e.g., wireless parking meters) deployed in certain locations (e.g., downtown) and during certain time periods (e.g., weekends) may be more tolerant to the response delays accompanying longer paging cycles. Meanwhile, some wireless devices (e.g., wireless parking meters) may have more capacity to hold a larger battery, and therefore, can utilize a shorter paging cycle. Thus, a single, one-size-fits-all paging cycle may not be suitable across different wireless applications and/or wireless devices.

Therefore, what is needed is a system, apparatus, and method that overcomes these significant problems found in conventional systems.

SUMMARY

Accordingly, systems, methods, and media are disclosed for an extended sleep operation in a wireless device.

In an embodiment, a method is disclosed that comprises using at least one hardware processor in a wireless device to: in an idle mode of the wireless device, operate according to an extended-sleep cycle, comprising an extended-sleep-ON duration an extended-sleep-OFF duration, by, over a plurality of extended-sleep cycles, during the extended-sleep-ON duration of the extended-sleep cycle, monitoring paging occasions, transmitted by a wireless communication network, and during the extended-sleep-OFF duration of the extended-sleep cycle, not monitoring the paging occasions.

In another embodiment, a method is disclosed that comprises using at least one hardware processor of a system to, for each of a plurality of wireless devices: storing, at the system, synchronized parameters used by the wireless device to define an extended-sleep cycle at the wireless device; based on the synchronized parameters, determining a transmission time at which to transmit a message over the wireless communication network such that the message will be received by the wireless device during a portion of the extended-sleep cycle during which the wireless device is monitoring paging occasions; queuing the message until the transmission time; and, at the transmission time, transmitting the message over the wireless communication network to the wireless device.

In an additional embodiment, a system comprises: at least one hardware processor; and one or more software modules that, when executed by the at least one hardware processor, perform one of the above methods.

In a further embodiment, a non-transitory computer-readable medium has instructions stored therein, wherein the instructions, when executed by a processor, cause the processor to perform one of the above methods.

BRIEF DESCRIPTION OF THE DRAWINGS

The details of the present invention, both as to its structure and operation, may be gleaned in part by study of the accompanying drawings, in which like reference numerals refer to like parts, and in which.

DETAILED DESCRIPTION

In an embodiment, systems, methods, and non-transitory computer-readable media are disclosed for an extended sleep operation in a wireless device. After reading this description, it will become apparent to one skilled in the art how to implement the invention in various alternative embodiments and alternative applications. However, although various embodiments of the present invention will be described herein, it is understood that these embodiments are presented by way of example and illustration only, and not limitation. As such, this detailed description of various embodiments should not be construed to limit the scope or breadth of the present invention as set forth in the appended claims.

1. System Overview 1.1. Infrastructure

Figure 1A:
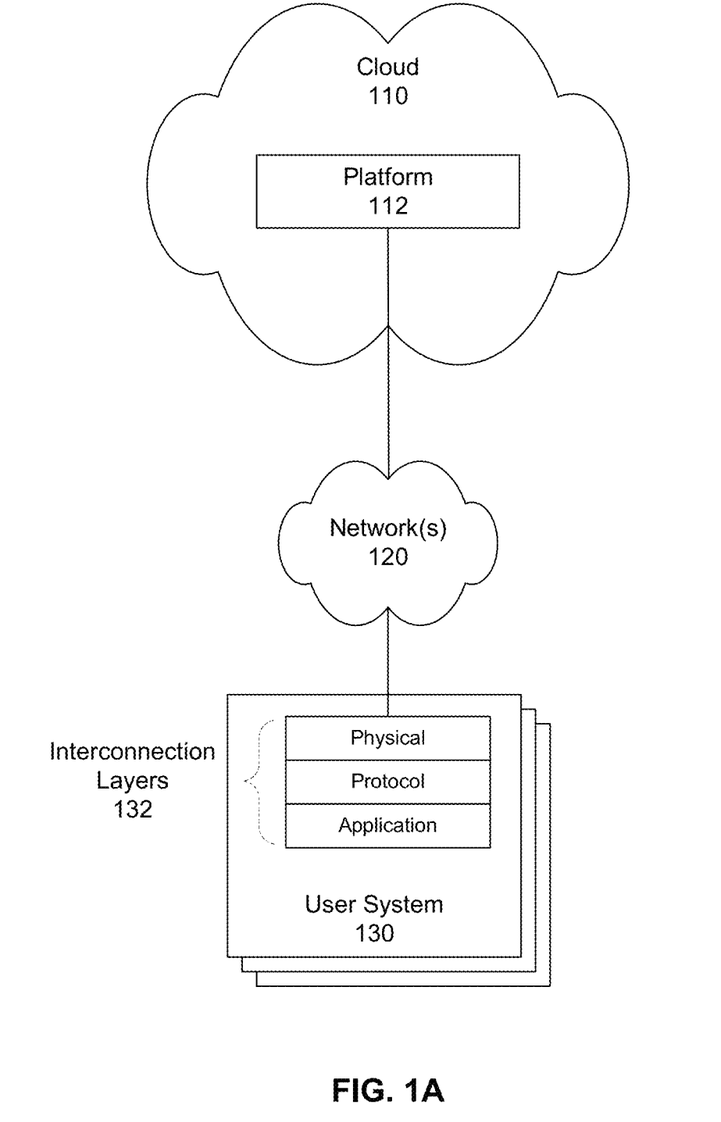
FIGS. 1A-1C illustrate example infrastructures, in which one or more of the processes described herein may be implemented, according to an embodiment.

FIG. 1A illustrates an example infrastructure in which the disclosed extended sleep operation may be implemented or utilized, according to an embodiment. The infrastructure may comprise a platform 112 (e.g., one or more servers, applications, databases, services, networks, and/or resources) which hosts and/or executes one or more of the various processes described herein, for example, as software implementing the various processes. As illustrated, platform 112 is comprised in a cloud 110, such that platform 112 is implemented using on-demand access to a pool of collocated and/or dispersed resources (e.g., servers, applications, databases, services, networks, etc.) that are shared with other entities (e.g., other platforms). Cloud 110 may comprise a public cloud, private cloud, and/or other cloud type, including a hybrid cloud comprising a combination of different clouds and/or cloud types. In an alternative infrastructure without cloud 110 or in addition to cloud 110, platform 112 may comprise one or more dedicated resources (e.g., servers, applications, databases, services, networks, etc.) that are not shared with other entities.

As illustrated, platform 112 is communicatively connected to one or more user systems 130 via one or more networks 120. Network(s) 120 may comprise the Internet, and platform 112 may communicate with user system(s) 130 through the Internet using standard transmission protocols, such as HyperText Transfer Protocol (HTTP), Secure HTTP (HTTPS), File Transfer Protocol (FTP), FTP Secure (FTPS), SSH FTP (SFTP), and/or the like, as well as proprietary protocols. Network(s) 120 may also comprise one or more wireless networks, such as a cellular network that employs the LTE standard for high-speed wireless communications. While platform 112 is illustrated as being connected to all user systems 130 through a single set of network(s) 120, it should be understood that platform 112 may be connected to different user systems 130 via different sets of network(s).

Platform 112 may comprise a web service which receives requests from user system(s) 130, and provides responses in JavaScript Object Notation (JSON), eXtensible Markup Language (XML), and/or any other suitable or desired format. In such embodiments, platform 112 may provide an application programming interface (API) which defines the manner in which user system(s) 130 may interact with the web service. Thus, user system(s) 130 can define their own user interfaces, and rely on the web service to implement or otherwise provide the backend processes, storage, and/or the like. A client application executing on one or more user system(s) 130 may interact with a server application executing on platform 112 to execute one or more or a portion of one or more of the various processes described herein (e.g., implemented in software). The client application may be "thin," in which case processing is primarily carried out server-side by the server application on platform 112. Alternatively, the client application may be "thick," in which case processing is primarily carried out client-side by user system(s) 130. It should be understood that the client application on user system(s) 130 may perform an amount of processing, relative to the server application on platform 112, at any point along this spectrum between "thin" and "thick," depending on the design goals of the particular implementation.

User system(s) 130 may comprise any type or types of devices capable of wired and/or wireless communication, including without limitation, desktop computers, laptop computers, tablet computers, wireless terminals (e.g., smart phones or other mobile devices), servers, game consoles, televisions, set-top boxes, electronic kiosks, point-of-sale terminals, pagers, position tracking devices, household appliances, sensors, Internet-of-Things (IoT) devices, Ultra-Tags/Modems, user equipment (UE), and/or the like. While only a few user systems 130 are illustrated, it should be understood that platform 112 may manage any number of user systems 130. As used herein, the term "wireless device" should be understood to include the subset of user systems configured for wireless communications, including UEs (e.g., UltraTags/Modems in an LTE communication network).

As illustrated, user system(s) 130 may implement a set of interconnection layers 132 to facilitate communications between applications executing on user system(s) 130 and platform 112 over network(s) 120. Although not shown, platform 112 may implement a similar or identical set of interconnection layers 132. In the illustrated embodiment, interconnection layers 132 comprise a physical layer, a protocol layer, and an application layer. However, this illustrated set of layers is merely representative and non-limiting. In an embodiment, interconnection layers 132 may conform or be similar to the Open Systems Interconnection (OSI) reference model, which includes a physical layer, data-link layer, network layer, transport layer, session layer, presentation layer, and application layer, in that order from lowest to highest. In any case, interconnection layers 132 provide functions for providing a flow of data between a physical layer, in which bits are physically conveyed to and from network(s) 120 (e.g., at the electrical, optical, and/or radio level), at the lowest level and an application layer, which receives data, to be communicated, from applications (e.g., executing on user system(s) 130) and passes communicated data to those applications, at the highest level.

Figure 1B:
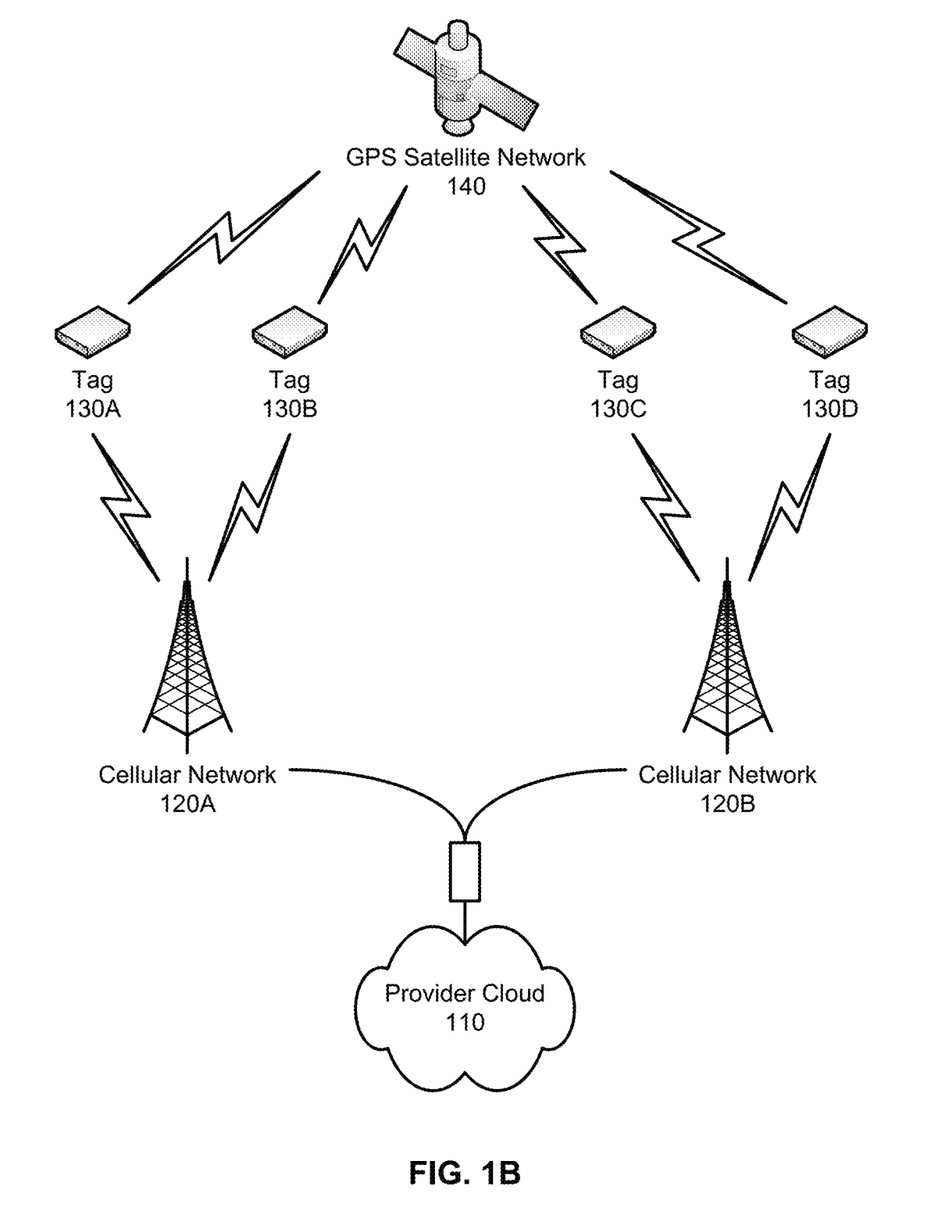

FIG. 1B illustrates a more specific example of an infrastructure in which the disclosed extended sleep operation may be implemented or utilized, according to an embodiment. In this example, user systems 130 comprise tags 130A-130D. Each of tags 130A-130D may be an UltraTag/Modem that comprises a battery and transceiver and periodically communicates with provider cloud 110 through at least cellular networks 120A or 120B. As an example, each tag may determine its location based on signals received from Global Positioning System (GPS) satellite network 140, and periodically transmit this location (e.g., as GPS coordinates) to provider cloud 110 through cellular network 120A or 120B.

Cellular networks 120A and 120B may be LTE communication networks, and tags 130A-130D may each comprise an LTE transceiver. However, although the extended sleep operation will primarily be described herein in the context of an LTE communication network, it should be understood that the extended sleep operation could be utilized with other types of communication networks.

Each deployed tag 130 may utilize the extended sleep operation described herein. Advantageously, the extended sleep operation within each tag 130 significantly reduces the tag's power consumption and extends the tag's battery life without impacting the performance and capacity of networks 120. Tags 130 may be optimized for applications with a limited power supply, such as applications which rely on coin cell batteries. For example, using embodiments of the disclosed extended sleep operation and power management techniques, the expected life of a tag 130 that uses inexpensive coin cell batteries can be extended to three years or more.

Power savings is facilitated by interactions between provider cloud 110 and the tags 130. For example, each tag 130 may, at all times, be paired with provider cloud 110, which maintains synchronized information on the operation, protocol, and state of interconnection layers 132 being executed within tag 130. The state information for each tag 130 may comprise an indication (e.g., version number) of the firmware and/or microcode being executed on the tag 130, the energy cycle status of a power management subsystem of the tag 130, and/or the like. Accordingly, each tag 130 works together with provider cloud 110 to increase power savings in the tag 130, for example, by reducing the ON period during an idle mode of the tag 130.

In an embodiment, provider cloud 110 utilizes or implements a highly-scalable message-queuing infrastructure. This infrastructure may be capable of sending and receiving small (e.g., 100-200 bytes) messages at a high frequency.

Figure 1C:
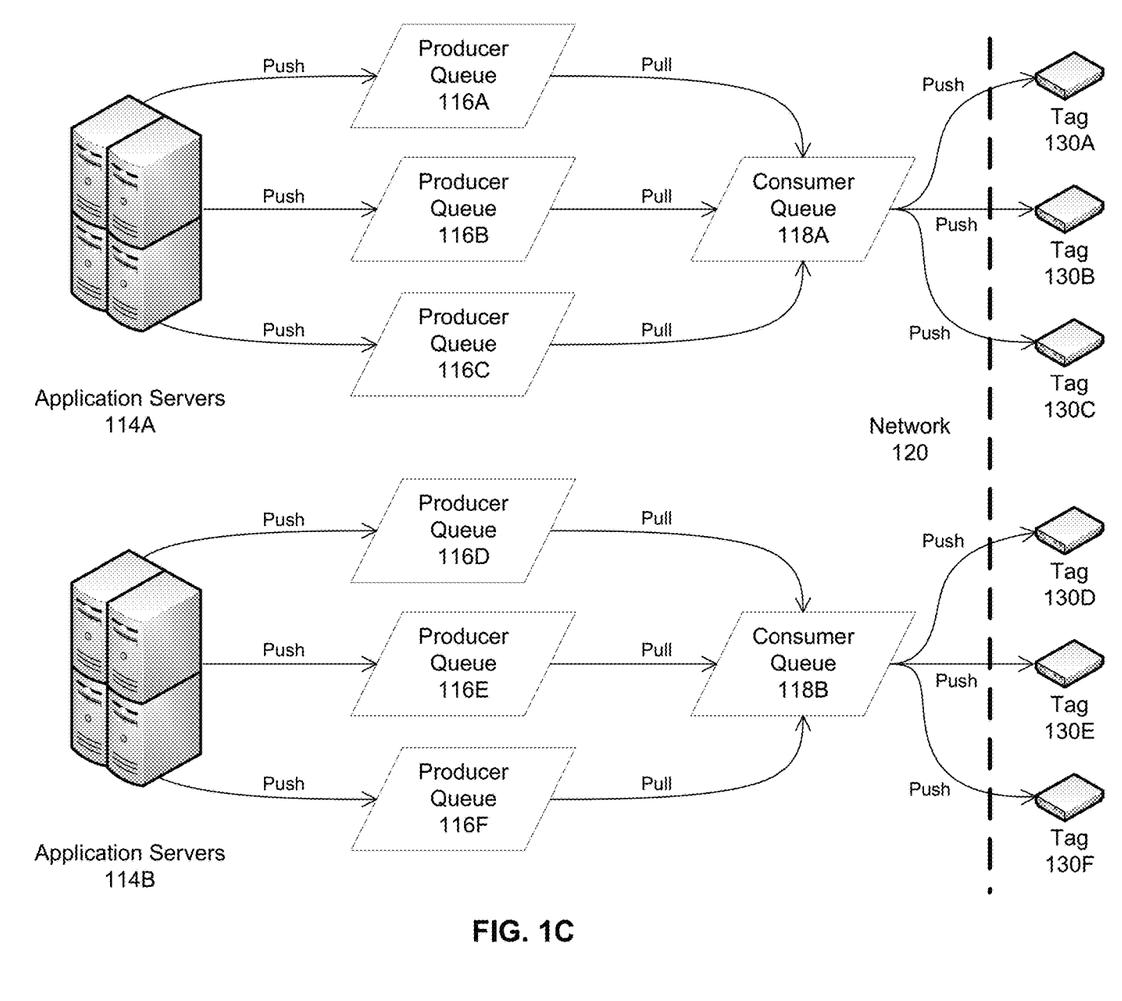

FIG. 1C illustrates a message-queuing infrastructure, according to an embodiment. Messages flow from applications servers 114, through the message queuing system, comprising producer queue(s) 116 and consumer queue(s) 118, and through network 120 (e.g., an LTE communication network), to tags 130. Application servers 114 may consist of a single application server, a group of application servers, or a plurality of groups of applications servers 114A and 114B. In addition, producer queues 116 may consist of a single producer queue per group of application servers 114 or a plurality of producer queues per group of application servers 114 (e.g., producer queues 116A-116C for application servers 114A, and producer queues 116D-116F for application servers 114B). Similarly, consumer queues 118 may consist of a single consumer queue per group of application servers 114 (e.g., consumer queue 118A for application servers 114A, and consumer queue 118B for application servers 114B) or a plurality of consumer queues per group of application servers 114.

In an embodiment, messages are pushed from application servers 114 into producer queue(s) 116. The messages are then pulled into consumer queue 118 from producer queue(s) 116. As illustrated a single consumer queue 118 may pull messages from a plurality of producer queues 116. Messages are then pushed from consume queue 118, through network 120, to one or more tags 130.

As an example, a customer using an UltraTag 130 to track his or her pet (e.g., an UltraTag embedded in a dog's collar) may request the pet's exact location through a user interface provided or supported by application servers 114. In response to the user's request, application servers 114 will generate, process, and push a location request message to producer queue 116, which will enqueue the location request message. Subsequently, consumer queue 118 will pull the location request message from producer queue 116, and enqueue the location request message for transmission via network 120 to UltraTag 130. When the location request message is processed from consumer queue 118, the location request message is transmitted over network 120 to UltraTag 130. After receiving the location request message, UltraTag 130 will respond with a message comprising its current location (e.g., GPS coordinates derived from GPS satellite network 140), and this message will flow through the message queuing system, to application servers 114, in reverse sequence.

When mass numbers of tags 130 need updates contemporaneously or simultaneously, the message queuing infrastructure can be scaled (e.g., by adding more producer queue(s) 116 and/or consumer queue(s) 118). For example, UltraTags may require regular updates of GPS almanac data in order to accurately report their locations at any given time. Such a mass update can be effectively scheduled via the message queuing infrastructure.

1.2. Example Processing Device

Figure 2:
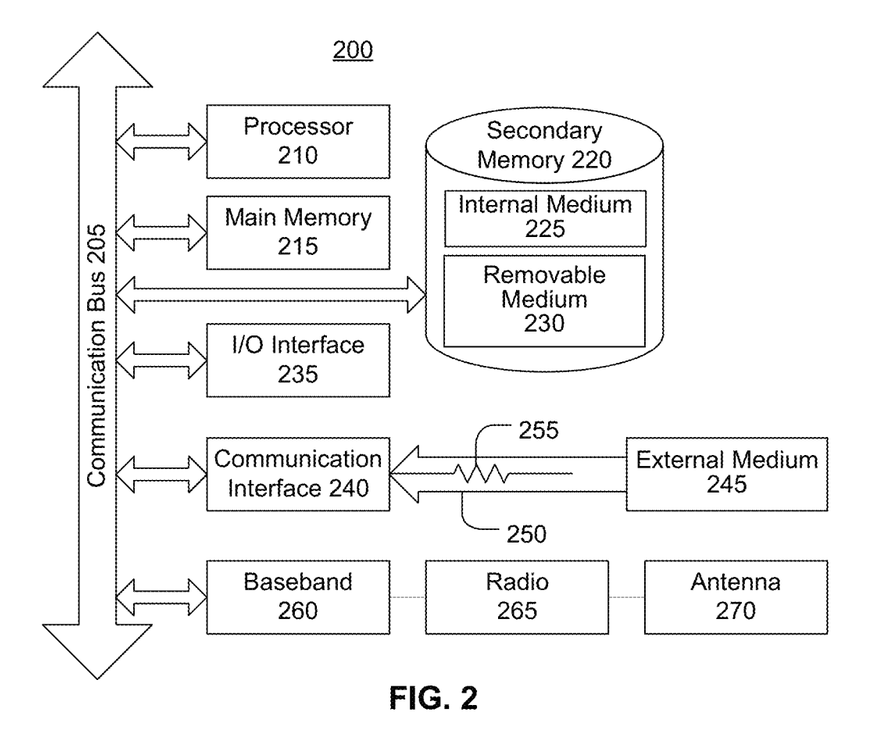
FIG. 2 illustrates an example processing system, by which one or more of the processed described herein may be executed, according to an embodiment.

FIG. 2 is a block diagram illustrating an example wired or wireless system 200 that may be used in connection with various embodiments described herein. For example system 200 may be used in conjunction with one or more of the processes described herein (e.g., to execute software implementing the processes), and may represent components of platform 112, user system(s) 130, and/or other processing devices described herein. System 200 can be any processor-enabled device that is capable of wired or wireless data communication. Other computer systems and/or architectures may be also used, as will be clear to those skilled in the art.

System 200 preferably includes one or more processors, such as processor 210. Additional processors may be provided, such as an auxiliary processor to manage input/output, an auxiliary processor to perform floating point mathematical operations, a special-purpose microprocessor having an architecture suitable for fast execution of signal processing algorithms (e.g., digital signal processor), a slave processor subordinate to the main processing system (e.g., back-end processor), an additional microprocessor or controller for dual or multiple processor systems, or a coprocessor. Such auxiliary processors may be discrete processors or may be integrated with the processor 210. Examples of processors which may be used with system 200 include, without limitation, the Pentium® processor, Core i7® processor, and Xeon® processor, all of which are available from Intel Corporation of Santa Clara, California.

Processor 210 is preferably connected to a communication bus 205. Communication bus 205 may include a data channel for facilitating information transfer between storage and other peripheral components of system 200. Furthermore, communication bus 205 may provide a set of signals used for communication with processor 210, including a data bus, address bus, and control bus (not shown). Communication bus 205 may comprise any standard or non-standard bus architecture such as, for example, bus architectures compliant with industry standard architecture (ISA), extended industry standard architecture (EISA), Micro Channel Architecture (MCA), peripheral component interconnect (PCI) local bus, or standards promulgated by the Institute of Electrical and Electronics Engineers (IEEE) including IEEE 488 general-purpose interface bus (GPIB), IEEE 696/S-100, and the like.

System 200 preferably includes a main memory 215 and may also include a secondary memory 220. Main memory 215 provides storage of instructions and data for programs executing on processor 210, such as one or more of the functions and/or modules discussed above. It should be understood that programs stored in the memory and executed by processor 210 may be written and/or compiled according to any suitable language, including without limitation C/C++, Java, JavaScript, Perl, Visual Basic, .NET, and the like. Main memory 215 is typically semiconductor-based memory such as dynamic random access memory (DRAM) and/or static random access memory (SRAM). Other semiconductor-based memory types include, for example, synchronous dynamic random access memory (SDRAM), Rambus dynamic random access memory (RDRAM), ferroelectric random access memory (FRAM), and the like, including read only memory (ROM).

Secondary memory 220 may optionally include an internal memory 225 and/or a removable medium 230. Removable medium 230 is read from and/or written to in any well-known manner. Removable storage medium 230 may be, for example, a magnetic tape drive, a compact disc (CD) drive, a digital versatile disc (DVD) drive, other optical drive, a flash memory drive, etc.

Removable storage medium 230 is a non-transitory computer-readable medium having stored thereon computer-executable code (e.g., disclosed software modules) and/or data. The computer software or data stored on removable storage medium 230 is read into system 200 for execution by processor 210.

In alternative embodiments, secondary memory 220 may include other similar means for allowing computer programs or other data or instructions to be loaded into system 200. Such means may include, for example, an external storage medium 245 and a communication interface 240, which allows software and data to be transferred from external storage medium 245 to system 200. Examples of external storage medium 245 may include an external hard disk drive, an external optical drive, an external magneto-optical drive, etc. Other examples of secondary memory 220 may include semiconductor-based memory such as programmable read-only memory (PROM), erasable programmable read-only memory (EPROM), electrically erasable read-only memory (EEPROM), or flash memory (block-oriented memory similar to EEPROM).

As mentioned above, system 200 may include a communication interface 240. Communication interface 240 allows software and data to be transferred between system 200 and external devices (e.g. printers), networks, or other information sources. For example, computer software or executable code may be transferred to system 200 from a network server via communication interface 240. Examples of communication interface 240 include a built-in network adapter, network interface card (NIC), Personal Computer Memory Card International Association (PCMCIA) network card, card bus network adapter, wireless network adapter, Universal Serial Bus (USB) network adapter, modem, a network interface card (NIC), a wireless data card, a communications port, an infrared interface, an IEEE 1394 fire-wire, or any other device capable of interfacing system 200 with a network or another computing device. Communication interface 240 preferably implements industry-promulgated protocol standards, such as Ethernet IEEE 802 standards, Fiber Channel, digital subscriber line (DSL), asynchronous digital subscriber line (ADSL), frame relay, asynchronous transfer mode (ATM), integrated digital services network (ISDN), personal communications services (PCS), transmission control protocol/Internet protocol (TCP/IP), serial line Internet protocol/point to point protocol (SLIP/PPP), and so on, but may also implement customized or non-standard interface protocols as well.

Software and data transferred via communication interface 240 are generally in the form of electrical communication signals 255. These signals 255 may be provided to communication interface 240 via a communication channel 250. In an embodiment, communication channel 250 may be a wired or wireless network, or any variety of other communication links. Communication channel 250 carries signals 255 and can be implemented using a variety of wired or wireless communication means including wire or cable, fiber optics, conventional phone line, cellular phone link, wireless data communication link, radio frequency ("RF") link, or infrared link, just to name a few.

Computer-executable code (i.e., computer programs, such as the disclosed application, or software modules) is stored in main memory 215 and/or the secondary memory 220. Computer programs can also be received via communication interface 240 and stored in main memory 215 and/or secondary memory 220. Such computer programs, when executed, enable system 200 to perform the various functions of the disclosed embodiments as described elsewhere herein.

In this description, the term "computer-readable medium" is used to refer to any non-transitory computer-readable storage media used to provide computer-executable code (e.g., software and computer programs) to system 200. Examples of such media include main memory 215, secondary memory 220 (including internal memory 225, removable medium 230, and external storage medium 245), and any peripheral device communicatively coupled with communication interface 240 (including a network information server or other network device). These non-transitory computer-readable mediums are means for providing executable code, programming instructions, and software to system 200.

In an embodiment that is implemented using software, the software may be stored on a computer-readable medium and loaded into system 200 by way of removable medium 230, I/O interface 235, or communication interface 240. In such an embodiment, the software is loaded into system 200 in the form of electrical communication signals 255. The software, when executed by processor 210, preferably causes processor 210 to perform the features and functions described elsewhere herein.

In an embodiment, I/O interface 235 provides an interface between one or more components of system 200 and one or more input and/or output devices. Example input devices include, without limitation, keyboards, touch screens or other touch-sensitive devices, biometric sensing devices, computer mice, trackballs, pen-based pointing devices, and the like. Examples of output devices include, without limitation, cathode ray tubes (CRTs), plasma displays, light-emitting diode (LED) displays, liquid crystal displays (LCDs), printers, vacuum fluorescent displays (VFDs), surface-conduction electron-emitter displays (SEDs), field emission displays (FEDs), and the like.

System 200 may also include optional wireless communication components that facilitate wireless communication over a voice network and/or a data network. The wireless communication components comprise an antenna system 270, a radio system 265, and a baseband system 260. In system 200, radio frequency (RF) signals are transmitted and received over the air by antenna system 270 under the management of radio system 265.

In one embodiment, antenna system 270 may comprise one or more antennae and one or more multiplexors (not shown) that perform a switching function to provide antenna system 270 with transmit and receive signal paths. In the receive path, received RF signals can be coupled from a multiplexor to a low noise amplifier (not shown) that amplifies the received RF signal and sends the amplified signal to radio system 265.

In an alternative embodiment, radio system 265 may comprise one or more radios that are configured to communicate over various frequencies. In an embodiment, radio system 265 may combine a demodulator (not shown) and modulator (not shown) in one integrated circuit (IC). The demodulator and modulator can also be separate components. In the incoming path, the demodulator strips away the RF carrier signal leaving a baseband receive signal, which is sent from radio system 265 to baseband system 260.

Baseband system 260 decodes the signal. Baseband system 260 also codes the digital signals for transmission and generates a baseband transmit signal that is routed to radio system 265. The radio mixes the baseband transmit signal with an RF carrier signal generating an RF transmit signal that is routed to antenna system 270 and may pass through a power amplifier (not shown). The power amplifier amplifies the RF transmit signal and routes it to antenna system 270, where the signal is switched to the antenna port for transmission.

Baseband system 260 is also communicatively coupled with processor 210, which may be a central processing unit (CPU). Processor 210 has access to data storage areas 215 and 220. Processor 210 is preferably configured to execute instructions (i.e., computer programs, such as the disclosed application, or software modules) that can be stored in main memory 215 or secondary memory 220. Computer programs can also be received from baseband processor 260 and stored in main memory 210 or in secondary memory 220, or executed upon receipt. Such computer programs, when executed, enable system 200 to perform the various functions of the disclosed embodiments. For example, data storage areas 215 or 220 may include various software modules.

2. Process Overview

Embodiments of processes for an extended sleep operation in a wireless device will now be described in detail.

The described processes may be embodied in one or more software modules that are executed by one or more hardware processors (e.g., as the client and/or server applications discussed above, which may be executed wholly by processor(s) of platform 112, wholly by processor(s) of user system(s) 130, or may be distributed across platform 112 and user system(s) 130 such that some portions or modules are executed by platform 112 and other portions or modules are executed by user system(s) 130). The described processes may be implemented as instructions represented in source code, object code, and/or machine code. These instructions may be executed directly by the hardware processor(s), or alternatively, may be executed by a virtual machine operating between the object code and the hardware processors.

Alternatively, the described processes may be implemented as a hardware component (e.g., general-purpose processor, integrated circuit (IC), application-specific integrated circuit (ASIC), digital signal processor (DSP), field-programmable gate array (FPGA) or other programmable logic device, discrete gate or transistor logic, etc.), combination of hardware components, or combination of hardware and software components. To clearly illustrate the interchangeability of hardware and software, various illustrative components, blocks, modules, circuits, and steps are described herein generally in terms of their functionality. Whether such functionality is implemented as hardware or software depends upon the particular application and design constraints imposed on the overall system. Skilled persons can implement the described functionality in varying ways for each particular application, but such implementation decisions should not be interpreted as causing a departure from the scope of the invention. In addition, the grouping of functions within a component, block, module, circuit, or step is for ease of description. Specific functions or steps can be moved from one component, block, module, circuit, or step to another without departing from the invention.

2.1. Idle Mode

Figure 3:
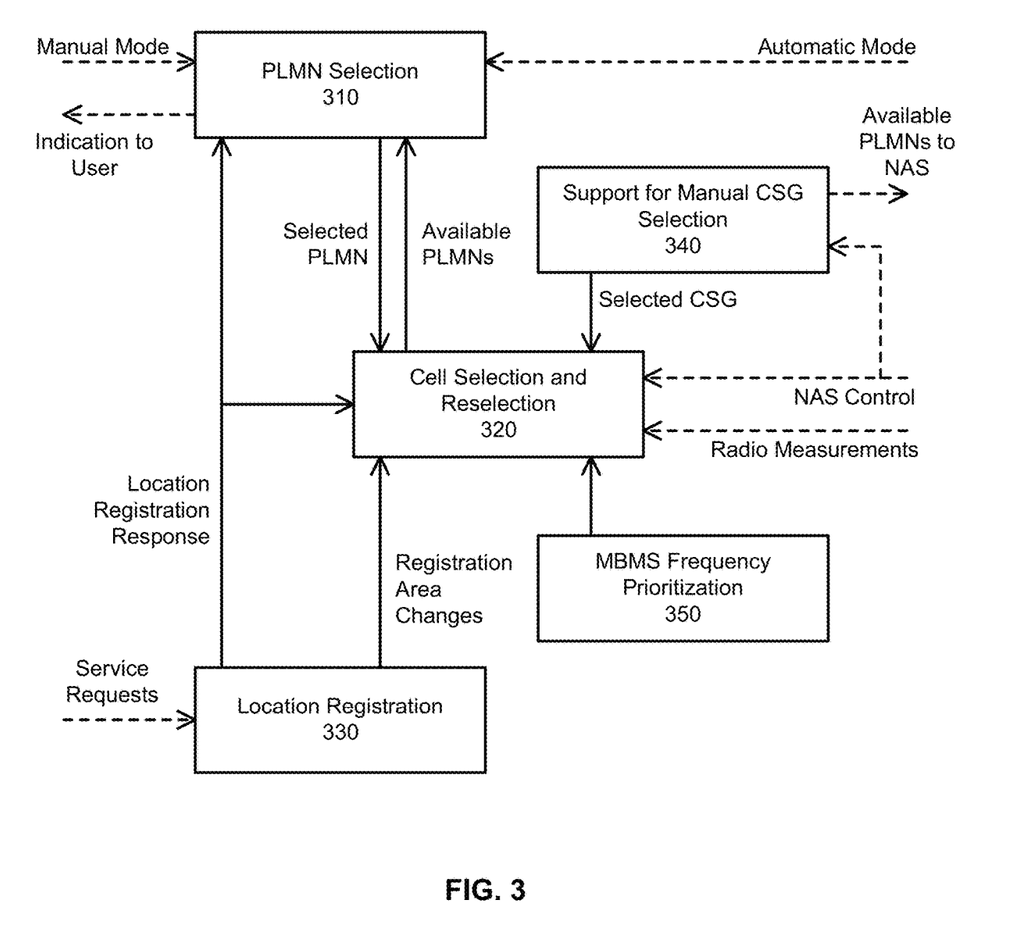
FIG. 3 illustrates an idle mode process, according to an embodiment.

The idle mode in a wireless device (e.g., tag 130) handles cell reselection, network selection, receiving, and paging. FIG. 3 illustrates an idle mode process, according to an embodiment. In the illustrated embodiment, the idle mode's tasks are divided into four processes: (1) public land mobile network (PLMN) selection 310; (2) cell selection and reselection 320; (3) location registration 330; and (4) support for manual closed subscriber group (CSG) selection 340. Details of the tasks undertaken in the idle mode, as specified in 3rd Generation Partnership Project (3GPP), can be found in TS 23.122, which is hereby incorporated herein by reference as if set forth in full.

When a wireless device (e.g., tag 130) is switched on, the wireless device attempts to contact a PLMN, which may be selected, either manually (e.g., via an interaction with a user) or automatically, by PLMN selection module 310. PLMN selection process 310 provides an indication of the selected PLMN, optionally with a CSG identifier, to cell selection and reselection process 320. For a given PLMN, a network access server (NAS) associates radio access terminals (RATs) with the PLMN. If available, the NAS may provide a list of equivalent PLMNs to be used by the access stratum (AS) for cell selection and reselection process 320.

Cell selection and reselection process 320 for a wireless device searches for a suitable cell of the selected PLMN and selects that cell to provide available services to the wireless device. In addition, the wireless device tunes to the control channel of the selected cell. This cell selection is known as "camping on the cell." The purposes of camping on a cell in the idle mode include:

(1) Enables the wireless device to receive system information from the PLMN.

(2) When the wireless device is registered and wishes to establish an RRC connection, the wireless device can initially access the network on the control channel of the cell on which it is camped.

(3) When the PLMN receives a communication for the registered wireless device, the PLMN knows (in most cases) the set of tracking areas in which the wireless device is camped. The PLMN may then send a paging message for the wireless device on the control channels of all cells in this set of tracking areas. The wireless device will receive the paging message, since the wireless device is tuned to the control channel of a cell in the set of registered tracking areas, and respond on that control channel.

(4) Enables the wireless device to receive Earthquake and Tsunami Warning System (ETWS) and Commercial Mobile Alert System (CMAS) notifications.

(5) Enables the wireless device to receive Multimedia Broadcast-Multicast Service (MBMS) (e.g., according to MBMS frequency prioritization process 350).

If necessary, after cell selection by cell selection and reselection process 320, a wireless device may register its presence, by means of a NAS registration procedure, in the tracking area of the selected cell. Specifically, cell selection and reselection process 320 provides the registration area changes to location registration process 330. As the outcome of a successful location registration, the selected PLMN becomes the registered PLMN for the wireless device, and a location registration response message may be returned to PLMN selection process 310 and cell selection and/or reselection process 320.

If the wireless device finds a more suitable cell, according to the relevant cell-reselection criteria, cell selection and reselection process 320 selects the new cell and camps on it. If the new cell does not belong to at least one tracking area to which the wireless device is registered, location registration is performed by location registration process 330.

If necessary, the wireless device may search for higher priority PLMNs at regular time intervals, and, when a new PLMN is selected by PLMN selection process 310, search for a suitable cell via cell selection and reselection process 320.

The NAS may trigger a search of available CSGs to provide support for manual CSG selection process 340.

If a wireless device loses coverage of its registered PLMN, either a new PLMN is automatically selected in an automatic mode of PLMN selection process 310, or an indication of available PLMNs is provided to a user for manual selection by the user in a manual mode of PLMN selection process 310.

If a wireless device is only capable of services that do not require registration, registration may not be performed in the wireless device.

If a wireless device is unable to find a suitable cell on which to camp or location registration fails (except in the case that location registration fails for cause #12, #14, #15, or #25), the wireless device may attempt to camp on a cell, irrespective of the PLMN identity, and enter a "limited service" state.

2.2. Discontinuous Reception for Paging

In an LTE communication system, paging refers to a procedure for transmitting a paging message to a UE in RRC idle mode or an Evolved Packet System (EPS) Mobility Management (EMM) registered state. A paging message is triggered by either a mobility management entity (MME) in the core network or an evolved Node B (eNB) in the radio access network.

2.3.1. Without Extended Sleep

Figure 4:
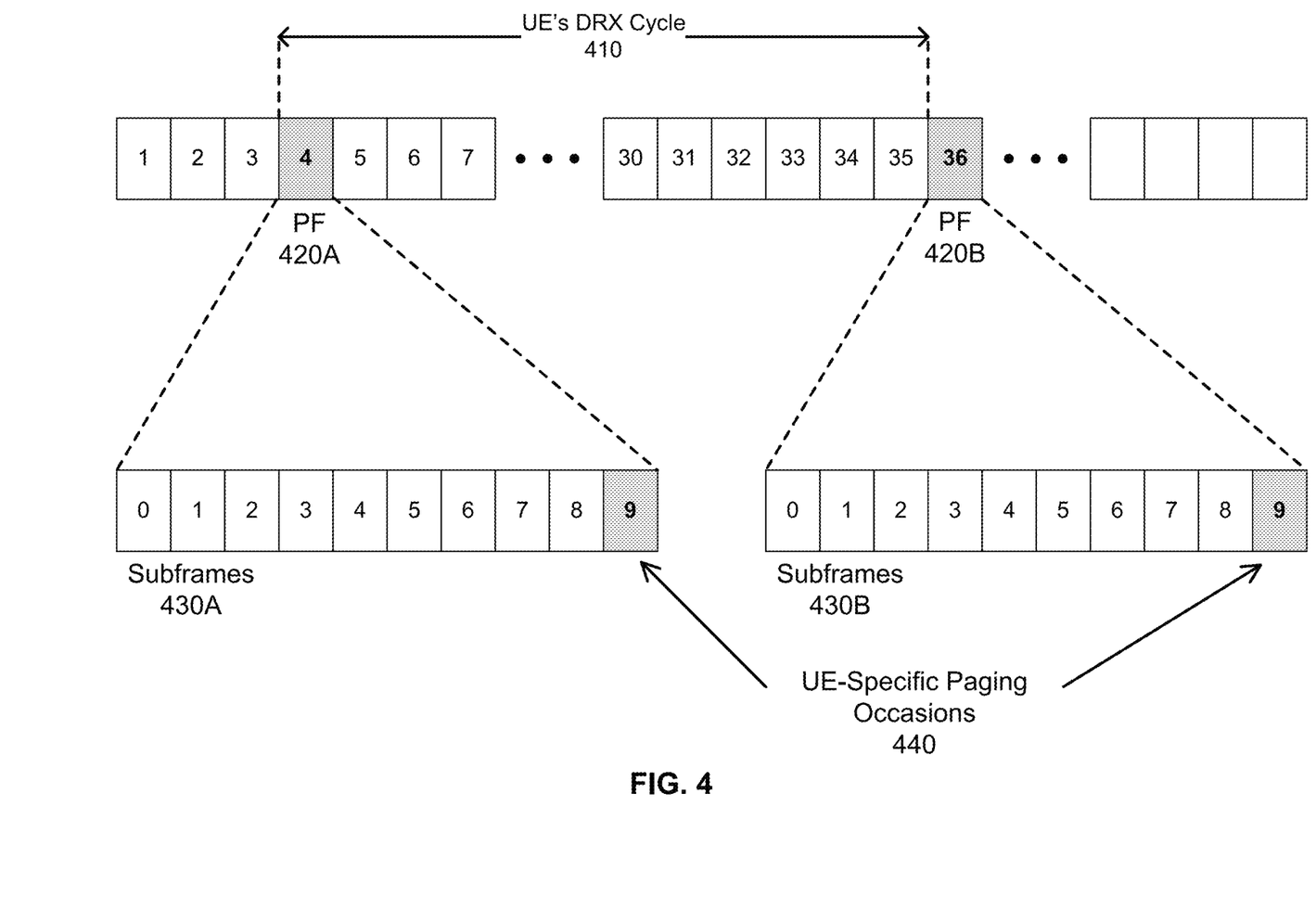
FIG. 4 illustrates an example of a Discontinuous Reception (DRX) cycle, according to an embodiment.

During the idle mode, a UE enters and maintains a sleep mode, defined by a Discontinuous Reception (DRX) cycle (e.g., which is defined in the System Information Block (SIB) 2). FIG. 4 illustrates an example of a DRX cycle 410 for a particular UE. DRX cycle 410 is illustrated in FIG. 4 as having a duration of T=32 radio frames and nB=T/2=16.

The UE periodically wakes up and monitors the Physical Downlink Control Channel (PDCCH) to check for the presence of a paging message in a paging frame (PF) 420 of a plurality of radio frames in the PDCCH. Specifically, the UE checks for any information encrypted by a Paging Radio Network Temporary Identifier (P-RNTI) in paging frame 420.

Each paging frame 420 comprises a plurality of subframes 430, representing one or more paging occasions. One of those subframes 430 represents a paging occasion 440 for the particular UE. Specifically, paging occasion 440 is a subframe 430 in which a P-RNTI, transmitted in the PDCCH, addresses the paging message to the particular UE.

In a given DRX cycle 410, there is always one paging occasion 440 for each UE. If the PDCCH indicates that a paging message is transmitted in the paging occasion 440, the UE demodulates the PDCCH to check whether the paging message is directed to that UE.

The UE only needs to monitor the PDCCH at a specific subframe 430 of a specific paging frame 420 within each DRX cycle 410. Specifically, the UE only needs to monitor each UE-specific paging occasion 440. At other times, the UE may remain in a sleep mode to save battery power.

2.4.2. With Extended Sleep

In an embodiment, an extended sleep window is used to reduce the frequency at which UEs periodically wake up to monitor the PDDCH during the idle mode. The extended sleep window may be configured in a UE (e.g., UltraTag/Modem 130) during a factory configuration that interconnection layers 132 use when the UE is first powered on. Thus, all UEs may be preloaded with a default configuration setting that includes the extended sleep window. After deployment in the field, the configuration parameters for the UEs may be modified or programmed via a firmware update.

The extended sleep window for each UE (e.g., UltraTag/Modem 130) may be synchronized with cloud 110 (e.g., platform 112). Thus, cloud 110 knows when each UE is in an extended sleep, including the UE's ON and OFF durations. Accordingly, cloud 110 can queue messages intended for a particular UE during that UE's extended sleep window, using the message queuing system discussed elsewhere herein (e.g., with respect to FIG. 1C).

Figure 5A:
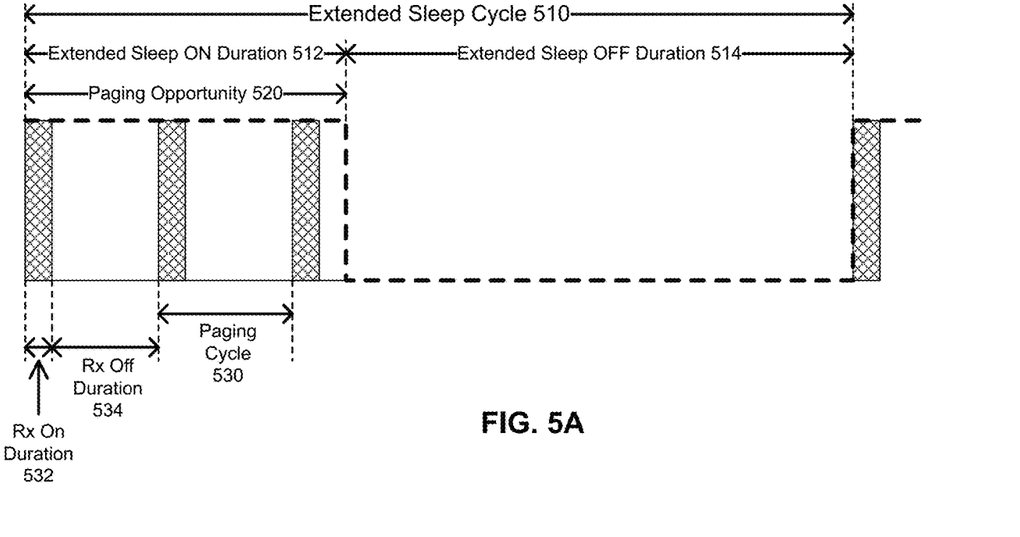
FIGS. 5A and 5B illustrate the structure of an extended sleep cycle, according to embodiments.

FIG. 5A illustrates the structure of an extended sleep cycle 510, according to an embodiment. Each extended sleep cycle 510 comprises an extended sleep ON duration 512 and an extended sleep OFF duration 514. During extended sleep ON duration 512, the UE periodically wakes up to monitor paging occasions (e.g., paging occasions 440), according to a predetermined paging or DRX pattern. During extended sleep OFF duration 514, the UE does not wake up to monitor paging occasions, regardless of the predetermined paging or DRX pattern. In other words, when the extended sleep window is active in a UE, the UE only wakes up and monitors the PDCCH during paging frames (e.g., paging frames 420) that are within the extended sleep ON duration 512 of each extended sleep cycle 510.

In an embodiment, each extended sleep ON duration 512 defines at least one paging occasion 440 for a particular UE to monitor and receive an incoming paging message. Since, as discussed elsewhere herein, cloud 110 knows the timing of the extended sleep ON duration 512 for each UE, cloud 110 can queue messages to each UE (e.g., UltraTag/Modem 130), in a message queuing system (e.g., described with respect to FIG. 1C), until the messages are able to be received by that UE, i.e., until the messages will be received within the UE's particular extended sleep ON duration 512. Once cloud 110 determines that a message, queued for a particular UE, can be received within that UE's extended sleep ON duration 512, cloud 110 can transmit the message to the UE (e.g., via LTE communication network 120).

2.5. Definition of Extended Sleep Operation

For purposes of the present application, the terms and definitions in 3GPP TR 21.905 apply. However, the definition of a term in the present application takes precedence over any definition of the same term in 3GPP TR 21.905.

Figure 5B:
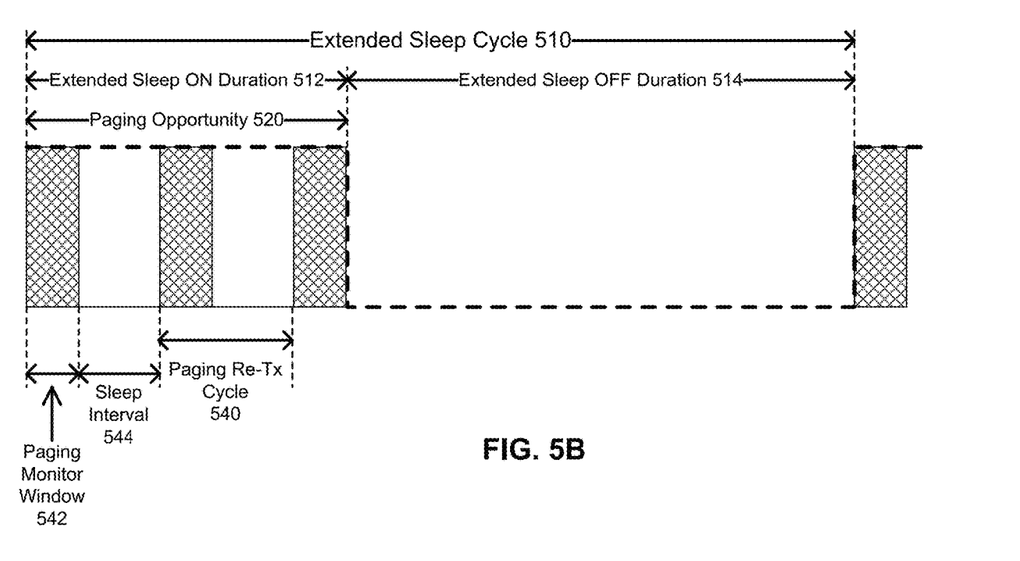

The term "extended sleep cycle" refers to the periodic repetition of the extended sleep ON duration 512, followed by a period of inactivity, such as extended sleep OFF duration 514. FIG. 5B illustrates the structure of an extended sleep cycle 510, according to an embodiment. The duration of extended sleep cycle 510 may be defined in terms of the number of paging cycles. For ease of description, it will be assumed herein that one paging cycle has a duration of 1.28 seconds. However, the embodiments described herein may be used with a paging cycle of any arbitrary length (e.g., 0.32, 0.64, 2.56 seconds in an LTE communication network), and thus, the particular length of a paging cycle is inconsequential to the present disclosure.

The parameter "exsSleepCycleLength" may be used to define the duration of each extended sleep cycle 510.

The parameter "exsOnDuration" may be used to define extended sleep ON duration 512, which, as illustrated in FIG. 5B, may be at the beginning of each extended sleep cycle 510. It is possible for exsOnDuration to equal exsSleepCycleLength, in which case there would be no extended sleep OFF duration 514.

The parameter "exsPagingRetransmissionCycle" defines the duration of a paging retransmission cycle, which comprises a paging monitor window 542 and an optional sleep interval 544 (i.e., a period of inactivity within extended sleep ON duration 512). It is possible for exsPagingRetransmissionCycle to equal exsOnDuration, in which case there is only a single paging retransmission cycle 540 (and consequently, only a single paging monitor window 542) within extended sleep ON duration 512.

The parameter "exsPagingMonitorDuration" defines the duration of paging monitor window 542, i.e., the number of consecutive paging cycles in which a UE wakes up to monitor the PDCCH. It is possible for exsPagingMonitorDuration to equal exsPagingRetransmissionCycle, in which case there is no sleep interval 544 in each paging retransmission cycle 540.

In an embodiment, exsSleepCycleLength, exsOnDuration, exsPagingRetransmissionCycle, and exsPagingMonitorDuration each have a value between 1 and 1024 (i.e., $2^{10}$) paging cycles. Table 1 below illustrates exemplary sets of these parameters for four different implementations of an extended sleep operation, with values specified in the number of paging cycles (e.g., number of DRX cycles 410):

TABLE 1

| Parameter | Set 1 | Set 2 | Set 3 | Set 4 |
|---|---|---|---|---|
| exsSleepCycleLength | 64 | 16 | 16 | 1024 |
| exsOnDuration | 16 | 16 | 4 | 0 |
| exsPagingRetransmissionCycle | 4 | 16 | 4 | 0 |
| exsPagingMonitorDuration | 2 | 16 | 4 | 0 |

Set 1 defines an extended sleep cycle 510 with a duration of 64 paging cycles, an extended sleep ON duration 512 of 16 paging cycles, a paging retransmission cycle 540 with a duration of 4 paging cycles, and a paging monitor window 542 with a duration of 2 cycles.

Set 2 defines an extended sleep cycle 510 with a duration of 16 paging cycles, an extended sleep ON duration 512 of 16 paging cycles, a paging retransmission cycle 540 with a duration of 16 paging cycles, and a paging monitor window 542 with a duration of 16 cycles. Set 2 is functionally similar to a non-customized LTE RRC IDLE paging cycle.

Set 3 defines an extended sleep cycle 510 with a duration of 16 paging cycles, an extended sleep ON duration 512 of 4 paging cycles, a paging retransmission cycle 540 with a duration of 4 paging cycles, and a paging monitor window 542 with a duration of 4 cycles. Set 3 corresponds to an extended sleep cycle 510, made up of 16 paging cycles, in which the UE wakes up to monitor the PDCCH only during the first 4 paging cycles of extended sleep cycle 510. The UE does not decode the PDCCH in the subsequent 12 paging cycles of extended sleep cycle 510.

Set 4 defines an extended sleep cycle 510 with a duration of 1024 paging cycles (i.e., the maximum duration in an embodiment), an extended sleep ON duration 512 of 0 paging cycles, a paging retransmission cycle 540 with a duration of 0 paging cycles, and a paging monitor window 542 with a duration of 0 cycles. In this case, the UE will receive one PDCCH and proceed to sleep for 1024 paging cycles. If a paging cycle is 1.28 seconds, this corresponds to approximately 22 minutes of sleep duration.

2.6. System Information Monitoring

In LTE, an eNB broadcasts System Information Blocks (SIBs) and Master Information Blocks (MIBs). The MIB/SIB comprises system information for the cell represented by the eNB. Normally, a UE will check the MIB/SIB when warranted by a change or when requested. However, the UE will miss any requests to check the MIB/SIB during extended sleep OFF duration 514.

Accordingly, in an embodiment, the UE checks the MIB/SIB according to a MIB/SIB read cycle. The MIB/SIB read cycle may be implemented using two parameters: exsMibSibMonitorFlag; and exsMibSibReadCycle.

If the parameter "exsMibSibMonitorFlag" is set (e.g., equals "1"), the UE will read a MIB/SIB once every MIB/SIB read cycle. The duration of a MIB/SIB read cycle is defined by the number of paging intervals specified by the parameter "exsMibSibReadCycle". The value of exsMibSibReadCycle may be chosen to be equal to, a divisor of, or a multiple of exsSleepCycleLength.

If exsMibSibMonitorFlag is not set (e.g., equals "0"), the extended sleep operation will not instigate any MIB/SIB reads. However, it should be understood that, even if exsMibSibMonitorFlag is not set, in an embodiment, MIB/SIB reads may still be instigated by operations other than the extended sleep operation.

In an embodiment, by default, the exsMibSubMonitorFlag is set (e.g., to "1") and exsMibSibReadCycle is equal to exsSleepCycleLength.

In an embodiment, the exsMibSibMonitorFlag and exsSleepCycleLength may be static parameters set at the factory. The determination of whether or not the exsMibSibMonitorFlag should be set, and the value of the exsSleepCycleLength, may be based on the parameters of the network that will be used by the wireless device and/or engineering tests in the field and lab. The need for setting the exsMibSibMonitorFlag may, for example, be based on whether or not MIB/SIB reads are instigated by protocol functions other than the extended sleep operation. If a wireless device already performs frequent MIB/SIB reads, it may not be necessary for the extended sleep operation to also instigate MIB/SIB reads, in which case the exsMibSibMonitorFlag could be left unset.

Frequent MIB/SIB reads may reduce time delays in responding to the changes in MIB/SIB data. However, frequent MIB/SIB reads may increase power consumption by the wireless device, and thus, reduce the wireless device's battery life.

In an embodiment, the exsMibSibMonitorFlag and exsSleepCycleLength may be semi-static parameters that can be updated, for example, by firmware updates sent to wireless devices deployed in the field. Alternatively, the exsMibSibMonitorFlag and exsSleepCycleLength may be on-the-fly, configurable, dynamic parameters that are programmed, for example, wirelessly as part of a configuration of the wireless device. Semi-static and dynamic parameters provide flexibility so that system behavior can be adapted even after the wireless device has been deployed in the field.

2.7. Cloud Implementation

While a message queuing system (e.g., as illustrated in FIG. 1C) maintains a communication path with tags 130, power savings is achieved by timing. Specifically, in order to conserve power, a tag 130 (e.g., UltraTag/Modem) is effectively turned "off" for the vast majority of time. This is what is referred to herein as an "extended sleep operation."

Consequently, the key to communicating a message from cloud 110 (e.g., platform 112) to tag 130 is transmitting the message at the right time, i.e., a time when tag 130 is known to be active and listening for messages on network 120 (e.g., an LTE communication network). In other words, cloud 110 times the transmission of the message so that it is received by a tag 130 within the tag's extended sleep ON duration 512. Failure to adhere to this timing may result in lost messages to tag 130, which may deprive a user of critical information at a critical time.

In an embodiment, cloud 110 times the push events from consumer queue 118 to be synchronized with the extended sleep cycle 510, as defined by the extended sleep parameters, managed by interconnection layers 132 of each tag 130. As discussed elsewhere herein, these extended sleep parameters may comprise exsSleepCycleLength, exsOnDuration, exsPagingRetransmissionCycle, and exsPagingMonitorDuration. Specifically, cloud 110 stores extended sleep parameters, defining the extended sleep cycle 510 including extended sleep ON duration 512, for each tag 130, and synchronizes these extended sleep parameters with the corresponding extended sleep parameters managed by interconnection layers 132 of each tag 130. Using these synchronized extended sleep parameters, cloud 110 can align the beginning of an extended sleep cycle 510, for purposes of transmitting a message from cloud 110 to a tag 130, with the extended sleep cycle 510 being used by that tag 130.

In an embodiment, for purposes of synchronization, both cloud platform 112 and tags 130 may have access to a common time, such as Coordinated Universal Time (UTC). For each tag 130 (e.g., UltraTag/Modem), the timing of an extended sleep cycle i may be defined as:

$$TB(i)=T0+(exsSleepCycleLength*PCL*i)+(S*PCL)$$
for $i=1\ldots$

T0 is an offset, such as the UTC time at 12:00 AM on Jan. 1, 2017, and PCL is the paging cycle length (e.g., 1.28 seconds). Thus, it should be understood that, for an extended sleep cycle i and a given tag 130, TB(i) represents the number of seconds from the beginning of the common time to the beginning of the (i+1)th extended sleep cycle 510 for the tag 130.

In an embodiment:

$$S=\text{IMSI modulo exsSleepCycleLength}$$

The international mobile subscriber identity (IMSI) is a sequence of integers (usually fifteen digits) uniquely identifying a mobile subscriber. In an embodiment, the IMSI for a particular tag 130 can be interpreted as a decimal integer number, in which the first digit represents the highest-order digit and the last digit represents the lowest-order digit. For example, if IMSI=12, the first and highest-order digit is "1" and the second and lowest-order digit is "2". Thus, IMSI=12 can be interpreted as the decimal integer "12" (rather than, for example, 1*16+2=18).

In an embodiment, S is a tag-specific parameter that is used to stagger the transmission times to tags 130. While S is described herein as the modulo of the IMSI and exsSleepCycleLength, it should be understood that S may be calculated or otherwise determined using different methods. Regardless of how it is calculated, the goal is for S to result in the even distribution of the timings of extended sleep cycles 510 across a plurality of tags 130, such that the extended sleep ON durations 512 for the tags 130 are staggered along the time axis.

In an embodiment, cloud 110 may time transmissions to account for delays incurred in cloud 110 and network 120 (e.g., an LTE communication network). For example, the transmissions may be timed such that a message for a tag 130 is transmitted from a wireless infrastructure port (e.g., an eNB) in a paging cycle which falls within the tag's extended sleep ON duration 512. Thus, in at least some instances, cloud 110 may transmit a message, intended for a tag 130, to network 120 before the start of the tag's extended sleep ON duration 512 (e.g., 5 second prior to the tag's extended sleep ON duration 512), such that, despite transmission delays between cloud 110 and network 120 and/or between network 120 and tag 130, the message is received at the start of the tag's extended sleep ON duration 512.

The above description of the disclosed embodiments is provided to enable any person skilled in the art to make or use the invention. Various modifications to these embodiments will be readily apparent to those skilled in the art, and the general principles described herein can be applied to other embodiments without departing from the spirit or scope of the invention. Thus, it is to be understood that the description and drawings presented herein represent a presently preferred embodiment of the invention and are therefore representative of the subject matter which is broadly contemplated by the present invention. It is further understood that the scope of the present invention fully encompasses other embodiments that may become obvious to those skilled in the art and that the scope of the present invention is accordingly not limited.

What is claimed is:

1. A method comprising using at least one hardware processor of a remote system to, for each of a plurality of wireless devices:
synchronize one or more parameters defining an extended-sleep cycle at the wireless device with the wireless device, wherein each extended sleep cycle comprises an extended-sleep-ON duration, during which the wireless device monitors paging occasions transmitted over a wireless communication network, and an extended-sleep-OFF duration, during which the wireless device does not monitor the paging occasions;
receive a message to be transmitted to the wireless device,
based on the synchronized one or more parameters, determine a transmission time at which to transmit the message to the wireless device over the wireless communication network, such that the message will be received within the extended-sleep-ON duration of an extended-sleep cycle;
queue the message until the transmission time; and
at the transmission time, transmit the message over the wireless communication network to the wireless device;
wherein the synchronized one or more parameters for each of the plurality of wireless devices comprise a timing TB of the extended-sleep-cycle i of that wireless device, defined by:

$$TB(i)=T0+(exsSleepCycleLength*PCL*i)+(S*PCL),$$

wherein T0 is an offset of a universal time standard, wherein exsSleepCycleLength is a duration of the extended-sleep cycle, wherein PCL is a length of a paging cycle, and wherein S is a parameter that is specific to the wireless device.

2. The method of claim 1, further comprising using the at least one hardware processor of the remote system to smooth an amount of messages trafficked between the remote system and the plurality of wireless devices, by defining the synchronized one or more parameters for each of the plurality of wireless devices such that the extended-sleep cycle of each of the plurality of wireless devices is staggered with respect to the extended-sleep cycle of at least one other one of the plurality of wireless devices.

3. The method of claim 1, wherein the synchronized one or more parameters for each of the plurality of wireless devices are defined based on an international mobile subscriber identity (IMSI) of that wireless device.

4. The method of claim 2, wherein S=IMSI modulo exsSleepCycleLength, wherein IMSI is an international mobile subscriber identity of that wireless device.

5. The method of claim 1, wherein the extended-sleep-ON duration comprises one or more paging cycles, wherein each of the one or more paging cycles comprises at least one paging occasion for the wireless devices, and wherein the transmission time is determined such that the message will be received by the wireless device during the at least one paging occasion.

6. The method of claim 1, wherein the transmission time precedes a start time of portion of the extended-sleep cycle during which the wireless device is monitoring paging occasions.

7. The method of claim 1, wherein the extended-sleep cycle is defined in terms of a number of paging cycles.

8. The method of claim 1, wherein synchronizing the one or more parameters comprises transmitting the one or more parameters to the wireless device.

9. The method of claim 8, wherein the one or more parameters are transmitted to the wireless device via firmware update.

10. The method of claim 1, further comprising using at least one hardware processor in at least one of the plurality of wireless devices to, in an idle mode of the at least one wireless device, operate according to the extended-sleep cycle defined at the at least one wireless device by:

during each extended-sleep-ON duration of the extended-sleep cycle, monitoring the paging occasions; and during each extended-sleep-OFF duration of the extended-sleep cycle, not monitoring the paging occasions.

11. The method of claim 10, wherein each extended-sleep-ON duration of the extended-sleep cycle comprises one or more paging cycles, wherein each of the one or more paging cycles comprises at least one paging occasion for the at least one wireless device, and wherein monitoring paging occasions during each extended-sleep-ON duration comprises monitoring the at least one paging occasion for the at least one wireless device in each of the one or more paging cycles.

12. The method of claim 11, wherein each extended-sleep-ON duration of the extended-sleep cycle comprises a plurality of paging cycles.

13. The method of claim 11, wherein monitoring the paging occasions during extended-sleep-ON duration comprises, during each of the one or more paging cycles:

during a first time period of the paging cycle, operating a receiver in an active mode to monitor a control channel for the at least one paging occasion for the at least one wireless device; and during a second time period of the paging cycle, operating the receiver in a sleep mode.

14. The method of claim 10, further comprising using the at least one hardware processor in the at least one wireless device to, in the idle mode, monitor a system information block (SIB) broadcast by a base station of the wireless communication network according to a SIB-read cycle.

15. The method of claim 14, wherein a duration of the SIB-read cycle is equal to a duration of the extended-sleep cycle.

16. The method of claim 14, wherein a duration of the SIB-read cycle is a divisor or a multiple of a duration of the extended-sleep cycle.

17. The method of claim 1, wherein the wireless device is an UltraTag.

18. A system comprising:

at least one hardware processor; and software configured to, when executed by the at least one hardware processor, for each of a plurality of wireless devices, synchronize one or more parameters defining an extended-sleep cycle at the wireless device with the wireless device, wherein each extended sleep cycle comprises an extended-sleep-ON duration, during which the wireless device monitors paging occasions transmitted over a wireless communication network, and an extended-sleep-OFF duration, during which the wireless device does not monitor the paging occasions;

receive a message to be transmitted to the wireless device, based on the synchronized one or more parameters, determine a transmission time at which to transmit the message to the wireless device over the wireless communication network, such that the message will be received within the extended-sleep-ON duration of an extended-sleep cycle;

queue the message until the transmission time, and at the transmission time, transmit the message over the wireless communication network to the wireless device, wherein the synchronized one or more parameters for each of the plurality of wireless devices comprise a timing TB of the extended-sleep-cycle i of that wireless device, defined by:

$$TB(i)=T0+(\text{exsSleepCycleLength}*PCL*i)+(S*PCL),$$

wherein T0 is an offset of a universal time standard, wherein exsSleepCycleLength is a duration of the extended-sleep cycle, wherein PCL is a length of a paging cycle, and wherein S is a parameter that is specific to the wireless device.

19. A non-transitory computer-readable medium having instructions stored thereon, wherein the instructions, when executed by a processor, cause the processor to, for each of a plurality of wireless devices:

synchronize one or more parameters defining an extended-sleep cycle at the wireless device with the wireless device, wherein each extended sleep cycle comprises an extended-sleep-ON duration, during which the wireless device monitors paging occasions transmitted over a wireless communication network, and an extended-sleep-OFF duration, during which the wireless devices does not monitor the paging occasions;

receive a message to be transmitted to the wireless device;

based on the synchronized one or more parameters, determine a transmission time at which to transmit the message to the wireless device over the wireless communication network, such that the message will be received within the extended-sleep-ON duration of an extended-sleep cycle;

queue the message until the transmission time; and at the transmission time, transmit the message over the wireless communication network to the wireless device;

wherein the synchronized one or more parameters for each of the plurality of wireless devices comprise a timing TB of the extended-sleep-cycle i of that wireless device, defined by:

$$TB(i) = T0 + (exsSleepCycleLength * PCL * i) + (S * PCL),$$

wherein T0 is an offset of a universal time standard, wherein exsSleepCycleLength is a duration of the extended-sleep cycle, wherein PCL is a length of a paging cycle, and wherein S is a parameter that is specific to the wireless device.

* * * * *